United States Patent [19]

Evans et al.

[11] Patent Number: 4,952,019
[45] Date of Patent: Aug. 28, 1990

[54] GRATING-COUPLED SURFACE-EMITTING SUPERLUMINESCENT DEVICE

[75] Inventors: Gary A. Evans, West Windsor Township, Mercer County; Nils W. Carlson, Lawrenceville, both of N.J.

[73] Assignee: General Electric Company, Schenectady, N.Y.

[21] Appl. No.: 263,464

[22] Filed: Oct. 27, 1988

[51] Int. Cl.$^5$ ............... G02B 6/34; H01L 33/00; H01S 3/08
[52] U.S. Cl. ............... 350/96.19; 350/96.11; 350/96.12; 357/17; 372/36; 372/49; 372/96; 372/102
[58] Field of Search ............... 372/44, 45, 36, 46, 372/49, 96, 97, 102; 350/96.11, 96.12, 96.19; 357/17, 19

[56] References Cited

U.S. PATENT DOCUMENTS

| | | | |
|---|---|---|---|
| 4,092,659 | 5/1978 | Ettenberg | 372/49 |
| 4,286,232 | 8/1981 | Puech et al. | 372/43 |
| 4,317,086 | 2/1982 | Scifres et al. | 372/49 |
| 4,639,922 | 1/1987 | Miller | 372/19 |
| 4,675,873 | 6/1987 | Miller | 372/19 |
| 4,730,331 | 3/1988 | Burnham et al. | 372/44 X |
| 4,744,088 | 5/1988 | Heinen et al. | 372/49 X |
| 4,758,090 | 7/1988 | Schuma | 356/350 |
| 4,764,934 | 8/1988 | Kwong et al. | 372/49 X |
| 4,786,132 | 11/1988 | Gordon | 350/96.19 |
| 4,794,618 | 12/1988 | Mito | 372/96 |
| 4,796,273 | 1/1989 | Yamaguchi | 372/49 X |
| 4,796,274 | 1/1989 | Akiba et al. | 372/96 |

FOREIGN PATENT DOCUMENTS

| | | | |
|---|---|---|---|
| 60-66489 | 4/1985 | Japan | 372/96 X |
| 61-4290 | 1/1986 | Japan | 372/96 X |
| 61-148890 | 7/1986 | Japan | 372/43 X |

OTHER PUBLICATIONS

K. C. Chang and T. Tamir, "Simplified Approach to Surface-Wave Scattering by Blazed Dielectric Gratings," *Applied Optics*, vol. 19, No. 2 (Jan. 15, 1980), pp. 282-288.

L. Figueroa et al., "Novel Mechanism For Fabrication of High-Power Superluminescent Light-Emitting Diodes (SLDs)," *Electronics Letters*, vol. 21, No. 23, (Nov. 7, 1985), pp. 1106-1107.

Stoll, "Distributed Bragg Deflector: A Multifunctional Integrated Optical Device", Appl. Optics, vol. 17, No. 16, 8/78, pp. 2562-2569.

*Primary Examiner*—William L. Sikes
*Assistant Examiner*—Brian M. Healy
*Attorney, Agent, or Firm*—Henry I. Steckler; James C. Davis, Jr.; Paul R. Webb, II

[57] ABSTRACT

A superluminescent diode has one end coupled to a DBR having a grating and the other end has a reflective coating. A broadlight spectrum is emitted for reduced speckle interference and phase noise when used in applications such as a gyroscope. The diode can be of the "P side down" type for good heat dissipation during continuous wave operation. Two gratings can be used in order to reduce beam divergence.

11 Claims, 2 Drawing Sheets

GRATING-COUPLED SURFACE-EMITTING SUPERLUMINESCENT DEVICE

BACKGROUND OF THE INVENTION

The present invention relates to superluminescent (SL) devices, and more particularly, to such devices that are coupled to gratings.

Superluminescent devices, such as diodes are less coherent (broader bandwidth) than laser diodes, and therefore, have less speckle interference patterns that are random in time. For certain applications, such as gyroscopes, this is desirable, since the gyroscope output signal represents a phase difference and any random interference patterns result in phase noise in the output signal. SL devices normally have two ends with a reflecting and antireflecting coatings respectively disposed on the ends. The light is emitted by the end with the antireflecting coating. However, some small amount of light will be reflected from the antireflecting coating resulting in speckle interference patterns, and thus, phase noise in a gyroscope output signal, although less than that when a laser, which has two reflecting coatings, is used therein.

It is, therefore, desirable to have an SL device which has reduced speckle interference patterns, and thus, produces reduced phase noise when used in an application such as a gyroscope.

SUMMARY OF THE INVENTION

A device in accordance with the invention comprises a superluminescent diode having a pair of ends; a reflecting coating disposed at one of said ends; and a distributed Bragg reflector having a first grating optically coupled to the other end to reduce speckle interference patterns.

DETAILED DESCRIPTION OF THE PREFERRED EMBODIMENTS

Figure 1:
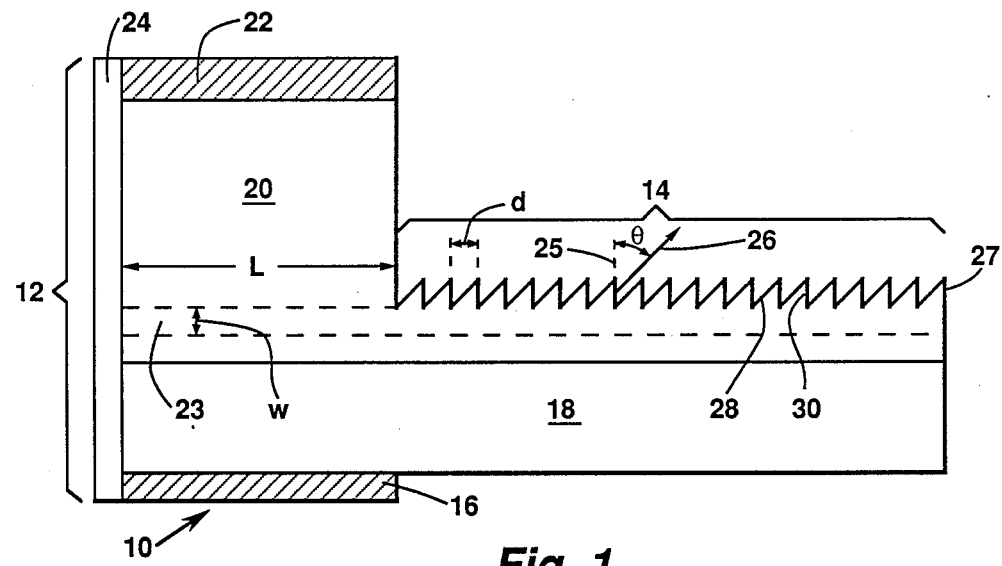
FIG. 1 is a side view of a first embodiment of the invention.

As shown in FIG. 1, a device in accordance with the invention, generally designated 10, comprises an SL diode 12, and a distributed Bragg reflector (DBR) 14. In turn, the SL diode 12 comprises an N-contact 16, e.g., such as sintered Ni/Ge/Au, a substrate 18, such as GaAs, an intermediate layer section 20, and a P-contact 22. As known in the art, the section 20 actually comprises a plurality of layers. Details of the section 20 and the contacts 16 and 22 are the same as for the corresponding elements of a laser diode such as are shown in U.S. patent application Ser. No. 230,105, pending, filed Aug. 9, 1988, in the name of D. Carlin, and entitled "Surface Emitting Lasers With Combined Output." Most importantly, the section 20 comprises an optical waveguide 23 having an active length "L" and a width "W." Typically "W" is between about 1 to 4 μm and "L" is between about 100 to 500 μm. A reflective coating 24, e.g., such as shown in U.S. Pat. No. 4,092,659, is disposed at only one end of the SL diode 12. As shown in said patent, the coating 24 preferably comprises 3 pairs of alternate layers of Al₂O₃ and SO₂, each layer being one-quarter wavelength thick for a total of 6 layers. The DBR 14 is optically coupled to the other end of the diode 12 and has a grating 27 that is formed in part of a P-cladding layer (not shown) of the waveguide 23 of the section 20, if the SL diode 12 is of the quantum well (QW) type, or the grating 27 is part of the waveguide 23 of the section 20, if the diode 12 is of the double heterostructure-large optical cavity (DH-LOC) type. Both types are shown in said Carlin application.

The DBR 14 is of the second order type, which is the only order that provides a single output beam with high efficiency. The first order of the second order DBR 14 is used, which provides light at an angle $\theta$ to the normal 25 of the layer 20 as shown by the arrow 26. The angle $\theta =$ $$\arc\sin\left[\frac{\lambda}{d} - n_e\right],$$

wherein $\lambda$ = wavelength of light in free space, d = grating period, and $n_e$ = effective index of refraction of the waveguide 23 in the layer 20. Preferably, in order to maximize the emitted light, the grating 27 is blazed in the first order, e.g., the grating portion 28 is typically at a 45 degree angle to said normal 25, although other angles for the blazing can be used, while grating portion 30 is parallel to said normal. The grating period "d" is selected so that only single pass gain occurs, this can be done by satisfying the inequality $$\arc\sin\left[\frac{2\lambda}{n_e d} - 1\right] >> \frac{W}{L}.$$

The spacing "d" typically is between about 2500 Å to 3500 Å (Angstroms). Details about blazed gratings are found in the article "Simplified approach to surface-wave scattering by blazed dielectric gratings," by K. C. Chang et al., Applied Optics, Vol. 19, No. 2, Jan. 15, 1980, pages 282-288.

In operation, positive and negative voltages are applied to the contacts 22 and 16, respectively, and then stimulated emission of photons occurs in the SL diode 12. Since only one reflective coating 24 is present and the above inequality is satisfied, only single pass gain occurs in the SL diode 12. Thus, relatively broad spectrum light is emitted by the SL diode 12 and then coupled out after said single pass directly from the DBR 14. There are no Fabry-Perot modes in the present invention, compared with an SL diode having both reflecting and antireflecting coatings that can give rise to residual Fabry-Perot modes. Therefore, there will be reduced speckle interference patterns, and hence phase noise, when used in an application, e.g., such as a gyroscope.

Figure 2:
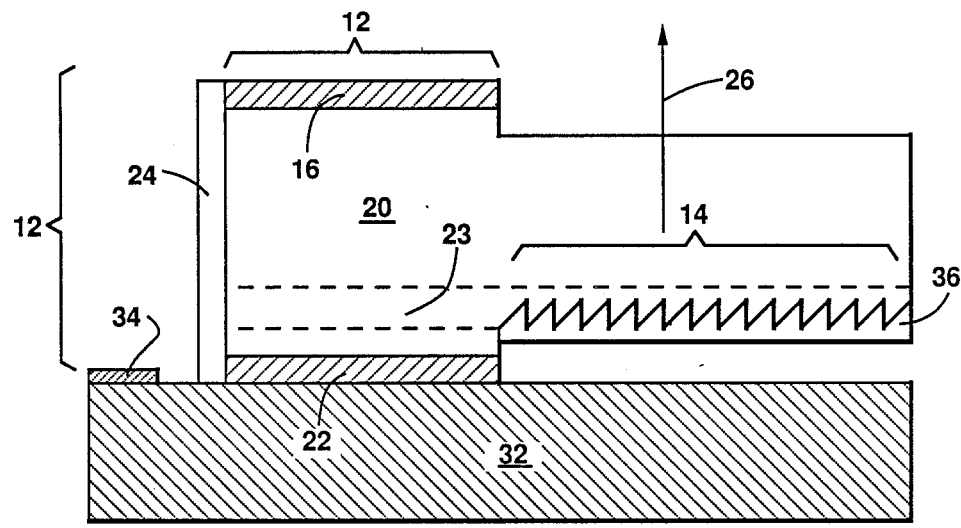
FIG. 2 is a side view of a second embodiment of the invention.

In the second embodiment of FIG. 2, the so called "P side down" type, and wherein corresponding elements have corresponding reference numerals, there is a heat sink 32, e.g., Cu, typically of at least 2 mils (0.005 cm) thickness. A contact 34, e.g., Au, between about 1000-2500 Å thick is on the sink 32. In contradistinction to FIG. 1, the P-contact 22 is below the intermediate layer section 20, while the N-contact 16 is thereabove. The DBR 14 is below some of the layers of the section 20, e.g., the waveguide 23 if the SL diode 12 is of the DH-LOC type or the quantum well and confining layers (not shown) if the SL diode 12 is of the QW type. A coating 36 can be highly reflecting and made as explained above for coating 24 or be partially reflecting, e.g., a layer of $Si_3N_4$. The light 26 emerges perpendicular to the longitudinal direction of the DBR 14 and directly from the diode 12, in particular, from the intermediate layer section 20 thereof.

The above embodiment has the active layer (DH-LOC type) or quantum well (QW type) close to the heat sink 32 for good heat dissipation, and therefore, good operation in the continuous wave mode is achieved.

Figure 3:
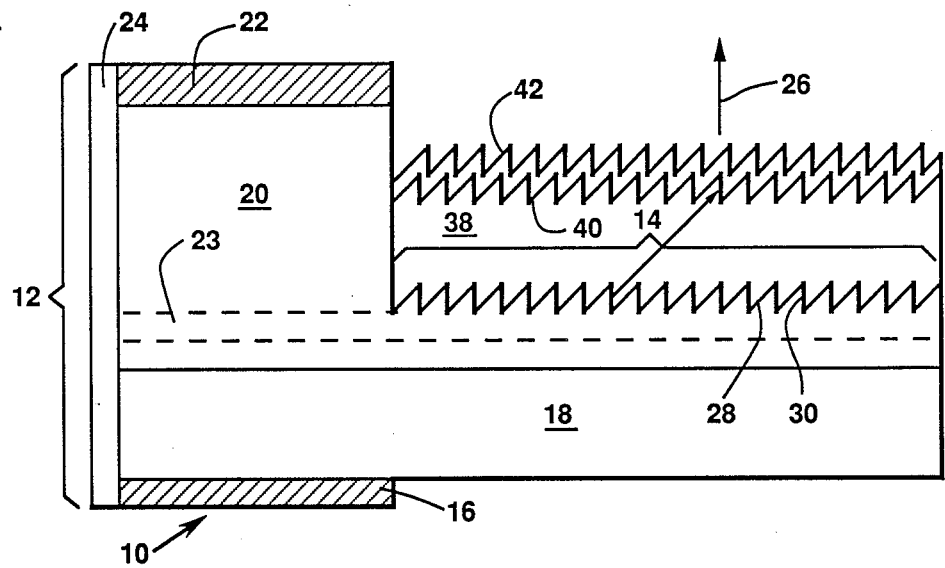
FIG. 3 shows a side view of a third embodiment of the invention with reduced beam divergence.

In FIG. 3, a transparent layer 38, which has a different index of refraction than the DBR 14 and a typical thickness between about 1-2 μm, overlies the DBR 14. The layer 38 can comprise AlGaAs, $SiO_2$, $Si_3N_4$, etc. A second grating 40 (first or second order) is at the top of the layer 38, with its longitudinal direction parallel to that of DBR 14. The grating 40 can have a different blazing than that of grating 27. Overlying the grating 40 is a layer 42. The condition for outcoupling light from layer 42 is that its index of refraction is greater than that of the waveguide 23. Layer 42 must be sufficiently thin so that the outcoupled light is not absorbed. About 100 Å thickness of InSb can be used as well as other materials. The light 26 emerges perpendicularly or some other angle from the grating 40. The embodiment of FIG. 3 has a beam divergence of only about one degree or less for all wavelengths compared to a divergence between about 2-3 degrees for the embodiments of FIGS. 1 and 2 for a DBR length between about 200-300 μm.

What is claimed is:

1. A device comprising:
   a superluminescent diode having a pair of ends;
   a reflecting coating disposed at one of said ends; and
   a distributed Bragg reflector having a first grating optically coupled to the other end.

2. The device of claim 1 wherein light is emitted directly from said grating.

3. The device of claim 1 wherein light is emitted directly from said diode.

4. The device of claim 1 wherein said diode is of the DH-LOC type.

5. The device of claim 1 wherein said diode is of the QW type.

6. The device of claim 1 wherein said grating is blazed.

7. The device of claim 1 further comprising a heat sink coupled to said diode.

8. The device of claim 1 further comprising a second grating optically coupled to said first grating.

9. The device of claim 8 wherein said gratings are in parallel and extend perpendicular to emitted light.

10. The device of claim 9 further comprising a waveguide optically coupled to said diode and having an effective index of refraction and a layer disposed over said second grating and having a higher index of refraction than said waveguide.

11. The device of claim 1 wherein said diode comprises an optical waveguide having an active length of L and a width of W and $$\arc \sin\left[\frac{2\lambda}{n_e d} - 1\right] >> \frac{W}{L},$$

wherein λ=wavelength of light in free space, d=grating period, and $n_e$=effective index of refraction of said optical waveguide.

* * * * *